(12) United States Patent
Matsuura et al.

(10) Patent No.: US 9,915,689 B2
(45) Date of Patent: Mar. 13, 2018

(54) MEASUREMENT DEVICE AND MOUNTING UNIT

(71) Applicant: OMRON Corporation, Kyoto-shi, Kyoto (JP)

(72) Inventors: Keiki Matsuura, Kyoto (JP); Hiroshi Imai, Kyoto (JP); Hiroyuki Tokusaki, Kyoto (JP); Yasuhiro Kawabata, Kyoto (JP); Goro Kawakami, Kyoto (JP); Atsuhiro Okamura, Kyoto (JP)

(73) Assignee: OMRON Corporation, Kyoto (JP)

( * ) Notice: Subject to any disclaimer, the term of this patent is extended or adjusted under 35 U.S.C. 154(b) by 213 days.

(21) Appl. No.: 14/776,781

(22) PCT Filed: Jan. 22, 2014

(86) PCT No.: PCT/JP2014/051185
§ 371 (c)(1),
(2) Date: Sep. 15, 2015

(87) PCT Pub. No.: WO2014/141745
PCT Pub. Date: Sep. 18, 2014

(65) Prior Publication Data
US 2016/0018448 A1    Jan. 21, 2016

(30) Foreign Application Priority Data

Mar. 15, 2013 (JP) ................. 2013-053225

(51) Int. Cl.
*G01R 1/20* (2006.01)
*G01R 21/00* (2006.01)
(Continued)

(52) U.S. Cl.
CPC ............. *G01R 21/00* (2013.01); *G01R 15/00* (2013.01); *G01R 15/14* (2013.01);
(Continued)

(58) Field of Classification Search
None
See application file for complete search history.

(56) References Cited

U.S. PATENT DOCUMENTS 3,213,365 A * 10/1965 Wilson ................. G01R 1/22
                                                    324/115
4,728,887 A    3/1988 Davis
(Continued)

FOREIGN PATENT DOCUMENTS

CN    1039659 A    2/1990
JP    61-129580 A    6/1986
(Continued)

OTHER PUBLICATIONS

Extended European Search Report issued in corresponding European Application No. 14762987.7, dated Oct. 11, 2016 (9 pages).
(Continued)

*Primary Examiner* — Patrick Assouad
*Assistant Examiner* — Demetrius Pretlow
(74) *Attorney, Agent, or Firm* — Osha Liang LLP (57) ABSTRACT

A measurement device has a sensor that generates current by electromagnetic coupling to a power line, a measurement circuit that measures one of voltage and power, the voltage and the power being obtained by the current generated in the sensor according to voltage at the power line, a conductive member electrically connected to a signal ground line of the measurement circuit, and an insulating member that brings the conductive member close to an external conductor and insulates the conductive member from the external conductor.

9 Claims, 7 Drawing Sheets

(51) Int. Cl.
*G01R 15/00* (2006.01)
*G01R 19/00* (2006.01)
*G01R 15/14* (2006.01)
G01R 21/06 (2006.01)
G01R 1/18 (2006.01)
G01R 11/04 (2006.01)
G01R 22/06 (2006.01)

(52) U.S. Cl.
CPC .......... *G01R 19/0084* (2013.01); *G01R 1/18* (2013.01); *G01R 11/04* (2013.01); *G01R 21/06* (2013.01); *G01R 22/065* (2013.01)

(56) References Cited

U.S. PATENT DOCUMENTS

| | | | | |
|---|---|---|---|---|
| 6,737,978 | B1* | 5/2004 | Bartek | G01R 15/14 324/539 |
| 7,622,912 | B1* | 11/2009 | Adams | G01R 21/133 307/44 |
| 2002/0171433 | A1 | 11/2002 | Watanabe et al. | |
| 2003/0184325 | A1 | 10/2003 | Koch | |
| 2009/0027061 | A1* | 1/2009 | Curt | H02J 13/0055 324/539 |
| 2010/0194375 | A1 | 8/2010 | Cooper | |
| 2010/0301837 | A1* | 12/2010 | Higuma | G01R 21/06 324/140 R |
| 2011/0101956 | A1* | 5/2011 | Thorn | G01D 4/004 324/76.11 |
| 2013/0018609 | A1* | 1/2013 | Filippenko | G01R 21/133 702/62 |
| 2013/0134792 | A1* | 5/2013 | Bunsen | G01R 27/04 307/104 |
| 2014/0062471 | A1* | 3/2014 | Deak | G01R 21/06 324/252 |
| 2016/0351994 | A1* | 12/2016 | Louzir | G06K 7/10316 |

FOREIGN PATENT DOCUMENTS

| | | |
|---|---|---|
| JP | 2002-340939 A | 11/2002 |
| JP | 2002-365315 A | 12/2002 |
| JP | 2005-140506 A | 6/2005 |
| JP | 3761470 B2 | 3/2006 |
| JP | 2008-20270 A | 1/2008 |
| JP | 4251961 B2 | 4/2009 |
| JP | 4629625 B2 | 2/2011 |
| JP | 2011-223314 A | 11/2011 |
| KR | 2003-0054478 A | 7/2003 |
| KR | 2010-0135330 A | 12/2010 |

OTHER PUBLICATIONS

"Control Panel technical guide: How to protect a machine from malfunctions due to electromagnetic disturbance"; Schneider Electric Industries SAS; 2012 (23 pages).

Office Action in counterpart Chinese Patent Application No. 201480011698.5 dated Dec. 27, 2016 (5 pages).

International Search Report issued in corresponding application No. PCT/JP2014/051185 dated Apr. 22, 2014 (2 pages).

Office Action in counterpart Korean Patent Application No. 10-2015-7024795 dated Sep. 8, 2016 (6 pages).

* cited by examiner

Sensor reference voltage (1.25V)

Fig. 3(B)

Sensor reference voltage (1.25V)

MEASUREMENT DEVICE AND MOUNTING UNIT

BACKGROUND

Technical Field

The present invention relates to a measurement device that measures voltage and power consumption of a facility in non-contact with a power line and a mounting unit that mounts the measurement device on an external distribution board.

Related Art

It is required to correctly measure the power consumption of each facility from the viewpoint of energy saving. It is necessary to measure the voltage in order to measure the power. When direct wire connection to the power line is performed to measure the voltage, electric work is required, and it is necessary to stop the facility. In order to avoid this trouble, there is a method in which the voltage is measured in a non-contact manner using capacitance coupling by firmly placing an electrode on wiring coating of the power line. When the sensor is placed by the method without requiring electric work, a GND terminal of a sensor circuit cannot be connected to ground (GND).

As to a power measurement method, for example, Patent Document 1 discloses a non-contact voltage measurement method in which a potential difference between a shield and probe is set to zero using an operational amplifier to exclude an influence of a floating capacitance. In a non-contact voltage measurement device disclosed in Patent Document 2, a phase difference of a voltage signal measured by a non-contact voltage measurement electrode is measured to obtain and correct a phase of a voltage signal of an insulated wire, thereby improving measurement accuracy. Patent Document 3 discloses a voltage measurement device that calculates a difference value between a detection signal and a reference potential to control a gain of a feedback loop using a variable capacitance circuit.

In all the methods disclosed in Patent Documents 1 to 3, capacitance coupling is generated between an external noise source and a signal ground line of the measurement circuit, or an electrostatic capacitance (floating capacitance) fluctuates between the signal ground line and the ground, which may result in varying of the sensor output and may negatively affect the measurement accuracy.

Patent Document 1: Japanese Patent No. 3761470
Patent Document 2: Japanese Patent No. 4251961
Patent Document 3: Japanese Patent No. 4629625

SUMMARY

A measurement device according to one or more embodiments of the present invention prevents mixture of the noise in the sensor output without requiring wiring work, and a mounting unit according to one or more embodiments of the present invention mounts the measurement device on the external distribution board.

According to one or more embodiments of the present invention, a measurement device includes: a sensor configured to generate current by electromagnetic coupling to a power line; a measurement circuit configured to measure one of voltage and power, the voltage and power being obtained by the current generated in the sensor according to voltage at the power line; a conductive member electrically connected to a signal ground line of the measurement circuit; and an insulating member configured to bring the conductive member close to an external conductor and to insulate the conductive member from the external conductor.

The measurement device according to one or more embodiments of the present invention can measure one of the voltage and the power while the measurement circuit is mounted on the external conductor.

According to one or more embodiments of the present invention, an electrostatic capacitance is formed between the conductive member and the external conductor while the insulating member is interposed between the conductive member and the external conductor. The electrostatic capacitance is formed between the conductive member and the external conductor while the insulating member is interposed between conductive member and the external conductor, and the noise current passed through the measurement circuit can be decreased by passing a noise current to the ground through the electrostatic capacitance. Therefore, the necessity of the work to connect the conductive member to the ground is eliminated, even a person who does not have advanced knowledge of electric facilities can easily place the measurement device, and one of the voltage and the power can accurately be measured while the influence of the noise is decreased.

According to one or more embodiments of the present invention, relative positions of the conductive member and the external conductor are fixed.

According to one or more embodiments of the present invention, the conductive member is a magnet. The measurement circuit can be fixed to the external conductor by the magnet.

According to one or more embodiments of the present invention, there is provided a mounting unit configured to mount a measurement circuit on an external conductor electrically connected to ground, the measurement circuit being configured to measure one of voltage and power, the mounting unit including: a conductive member electrically connected to signal ground of the measurement circuit; and an insulating member configured to come into contact with the conductive member to form electrostatic capacitance between the conductive member and the external conductor.

The use of the mounting unit can easily mount the commercially available measurement device on the external device, and the voltage and the power can accurately be measured while the influence of the noise is excluded.

Accordingly, in one or more embodiments of the present invention, the necessity of the wiring work is eliminated, and the voltage and the power consumption can accurately be measured while the mixture of the noise in the sensor output is prevented.

DETAILED DESCRIPTION

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. Although an example in which power consumption is measured with a measurement device of embodiments of the present invention will be described below, the measurement device of one or more of the below embodiments can be applied to not only the power consumption but also the measurement of voltage.

Figure 1:
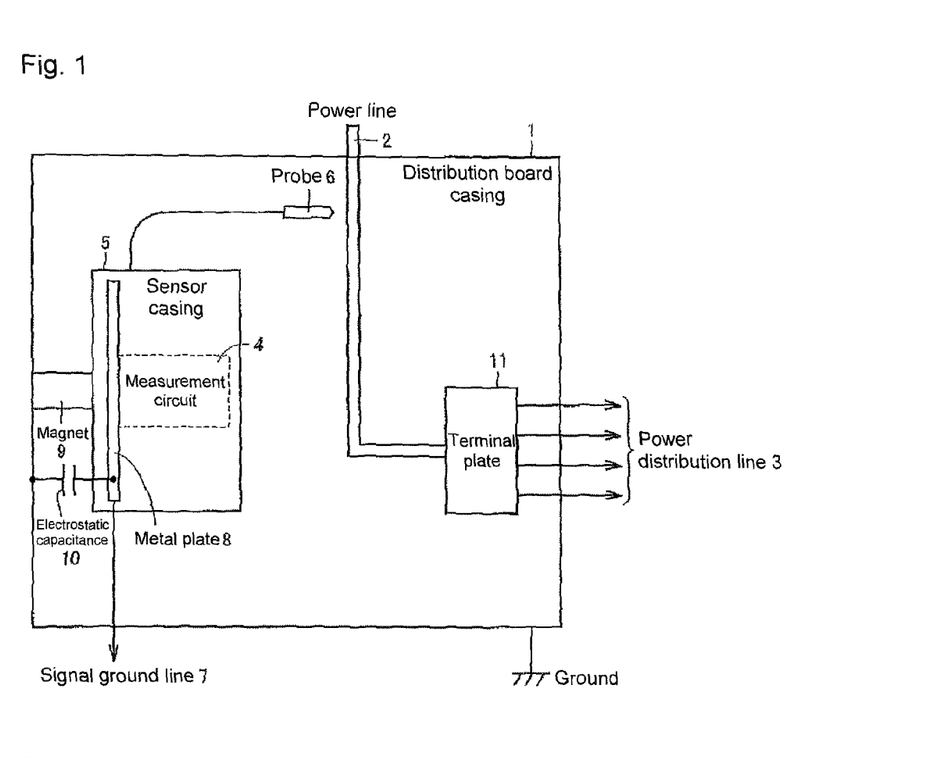
FIG. 1 is a block diagram illustrating a measurement device according to a first embodiment of the present invention.

FIG. 1 is a block diagram illustrating the measurement device of a first embodiment of the present invention. Referring to FIG. 1, a distribution board casing 1 is provided with a terminal board 11 and the like, and distributes an AC voltage input through a power line 2 to plural power distribution lines 3. The power distribution line 3 is connected to various electric instruments (not illustrated). The distribution board casing 1 made of a ferromagnetic material such as iron is connected to the ground (GND) to act as an external conductor. A measurement circuit 4 is provided in the distribution board casing 1 in order to measure power supplied from the power line 2.

The measurement circuit 4 is accommodated in a sensor casing 5. A probe 6 that works as an example of the sensor is connected to the measurement circuit 4. The probe 6 is electromagnetically coupled with the power line 2 to generate a current. The probe 6 may electromagnetically be coupled with the power distribution line 3 to measure power consumption of the electric instrument distributed by the power distribution line 3.

The measurement circuit 4 measures the current that is passed according to a voltage at the power line 2, the voltage being taken out by the probe 6. A metal plate 8 is provided in the sensor casing 5. The metal plate 8 works as a conductive member electrically connected to the signal ground line 7 of the measurement circuit 4. The sensor casing 5 is formed by molding resin that works as an insulating member. A magnet 9 is fixed to a lateral surface or a bottom surface of the sensor casing 5, and the sensor casing 5 is attracted to an inside of a sidewall of the distribution board casing 1 by the magnet 9. Because the distribution board casing 1 is made of the ferromagnetic material, the distribution board casing 1 is strongly attracted by the magnet 9 to decrease a risk of deviating the sensor casing 5 from the distribution board casing 1.

The metal plate 8 is made of copper or aluminum, and formed into a plate shape (many holes may be punched), a rod shape, or a wire netting shape. The metal plate 8 may be separated into plural pieces as long as the pieces are electrically connected to each other. Alternatively, the metal plate 8 may be formed by a magnet made of a material such as iron, cobalt, nickel, and gadolinium. The metal plate 8 is provided while facing the distribution board casing 1 that is connected to the ground to work as the external conductor. An electrostatic capacitance 10 is formed between the distribution board casing 1 and the metal plate 8 while the resin sensor casing 5 that is of the insulating member is interposed between the distribution board casing 1 and the metal plate 8. The electrostatic capacitance 10 works to reduce the noise.

Figure 2:
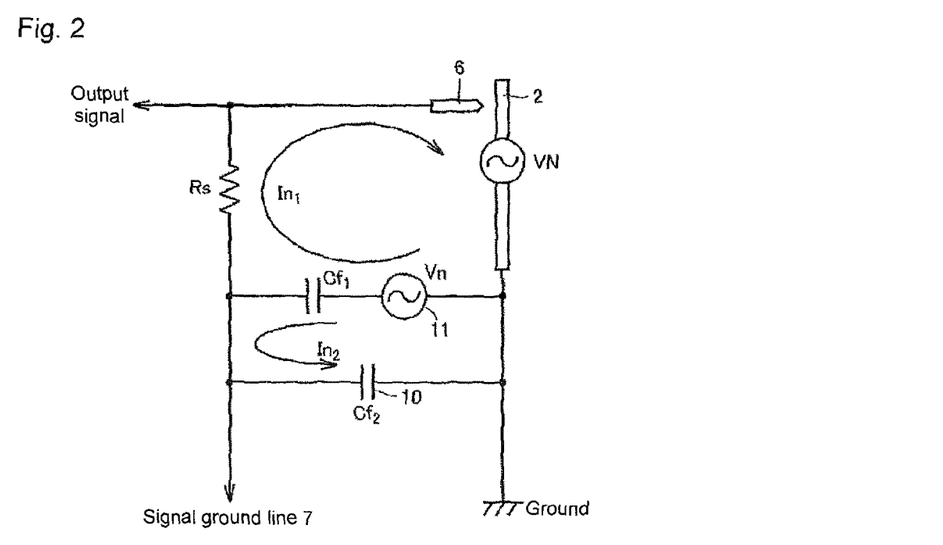
FIG. 2 is a circuit diagram illustrating a principle reducing a noise in the measurement device of the first embodiment of the present invention.

FIG. 2 is a circuit diagram illustrating a principle reducing the noise in the measurement device of the first embodiment of the present invention.

Operation of the first embodiment of the present invention will be described with reference to FIGS. 1 and 2. When the probe 6 is brought close to the power line 2 in the distribution board casing 1, an output signal is taken out as illustrated in FIG. 2. The output signal is proportional to a current that is passed according to a voltage $V_N$ applied to the power line 2 from the probe 6.

A detection resistance Rs is connected between the probe 6 and the signal ground line 7, and a voltage generated between the detection resistance Rs and the signal ground line 7 constitutes an input signal of the measurement circuit 4. Various external noises are mixed in the input signal, and the external noises are mixed in the measurement circuit 4. In FIG. 2, the external noises are shown in an assumption that a noise of a voltage Vn is mixed from a noise source 11 through a floating capacitance Cf1. The noise source 11 and the floating capacitance Cf1 are not illustrated in FIG. 1.

A noise current In is a sum of a current In1 passed from the measurement circuit 4 to the power line 2 and a current In2 passed to the GND through the electrostatic capacitance 10. The electrostatic capacitance 10 formed between the power line 2 and the metal plate 8 has a capacitance Cf2. The current In1 is passed from the measurement circuit 4 to the power line 2 by the voltage Vn at the noise source 11, and the current In2 is passed to the ground (GND) through the electrostatic capacitance 10 located between the metal plate 8 and the power line 2.

The current In1 has an influence on the measurement circuit 4. On the other hand, the current In2 has no influence on the measurement circuit 4 because the current In2 is not passed through measurement circuit 4. Because the currents In1 and In2 are passed from the noise source 11, the current In1 passed through the measurement circuit 4 can be decreased when the current In2 is increased. The current In1 passed through the measurement circuit 4 can be decreased by increasing the capacitance Cf2 of the electrostatic capacitance 10 between the metal plate 8 and the distribution board casing 1. Therefore, the influence of the noise on the measurement circuit 4 can be decreased.

Figure 3A:
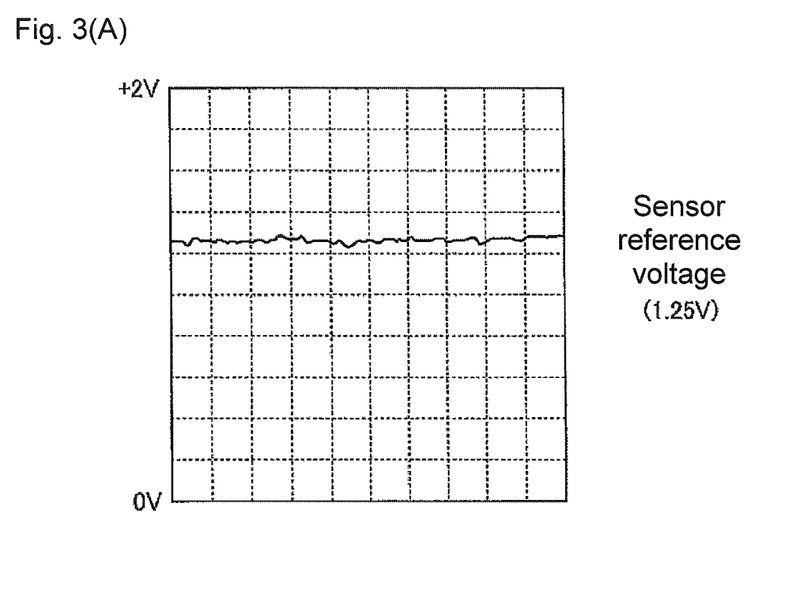
FIG. 3(A) is a view illustrating a noise amount when a sensor casing and a distribution board casing are coupled with a magnet in the first embodiment of the present invention.
Figure 3B:
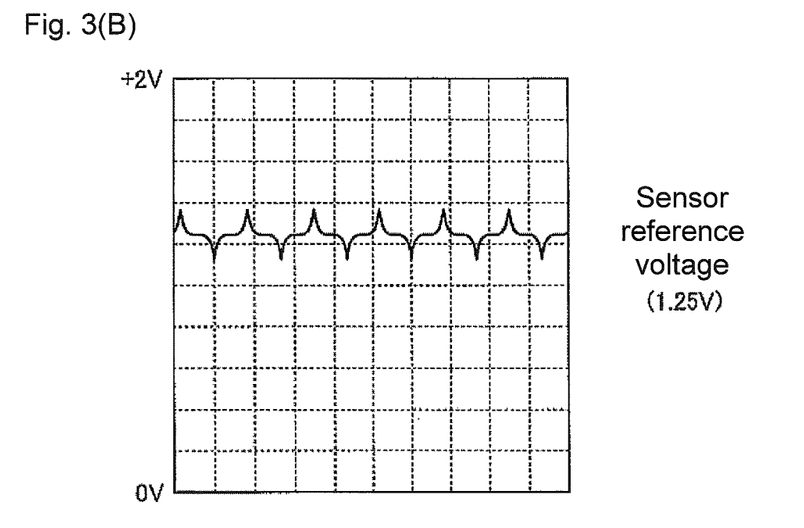
FIG. 3(B) is a view illustrating a noise amount when the sensor casing is not mounted on the distribution board casing.

FIG. 3(A) is a view illustrating a noise amount when the sensor casing and the distribution board casing are coupled with the magnet in the first embodiment of the present invention, and FIG. 3(B) is a view illustrating a noise amount when the sensor casing is not mounted on the distribution board casing. In FIGS. 3(A) and 3(B), a horizontal axis indicates time, and a vertical axis indicates a potential.

In the first embodiment of the present invention, as illustrated in FIG. 3(A), few noises emerge with respect to a sensor reference voltage of 1.25 V because of existence of the capacitance Cf2 of the electrostatic capacitance 10 between the metal plate 8 and the distribution board casing 1, the capacitance Cf2 being generated by attracting the sensor casing 5 to the distribution board casing 1 using the magnet 9. On the other hand, when the sensor casing 5 is not mounted on the distribution board casing 1, because of non-existence of the electrostatic capacitance Cf2, a noise having a potential of about 0.2 V emerges with respect to the sensor reference voltage of 1.25 V as illustrated in FIG. 3(B). Accordingly, an effect of the capacitance Cf2 of the electrostatic capacitance 10 between the metal plate 8 and the distribution board casing 1 can be confirmed.

Figure 4:
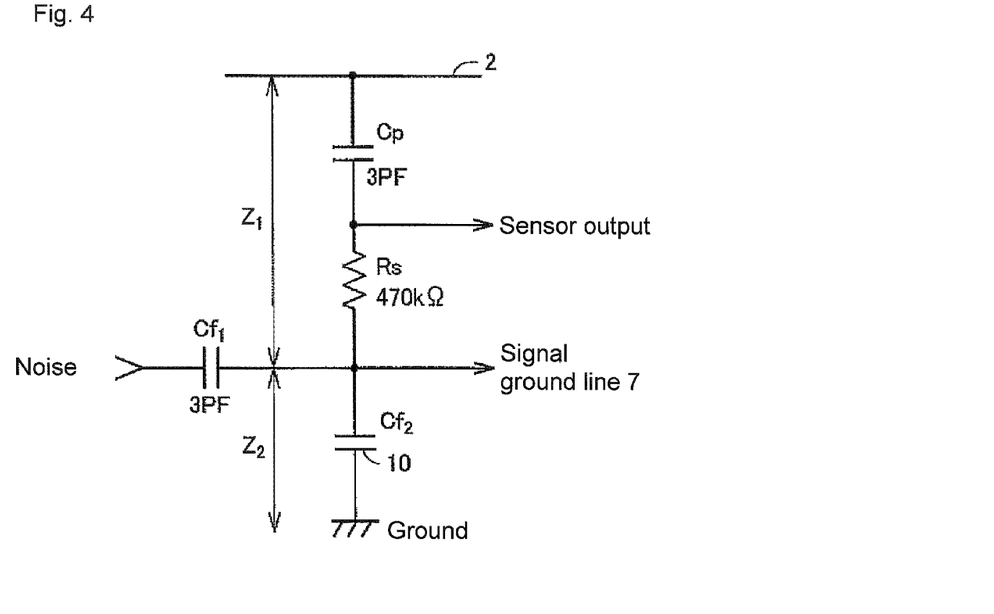
FIG. 4 is an equivalent circuit diagram illustrating a noise reducing effect of the measurement device of the first embodiment of the present invention.

FIG. 4 is an equivalent circuit diagram illustrating an effect reducing the noise in the measurement device of the first embodiment of the present invention.

In an equivalent circuit of FIG. 4, impedance Z1 existing between the power line 2 and the signal ground line 7 is expressed by the following equation because a capacitance Cp of about 3 pF of the probe 6 and wiring and the detection resistance Rs of about 470 kΩ of the measurement circuit 4 exist between the power line 2 and the signal ground line 7.

$$Z1 = Rs + 1/j\omega Cp$$

For example, because the capacitance Cp of the probe 6 and the wiring is several picofarads while the detection resistance Rs is 470 kΩ, the impedance Z1 depends substantially on the capacitance Cp of the probe 6 and the wiring, and has a relatively large value.

On the other hand, because the electrostatic capacitance 10 having the capacitance Cf2 of about 500 to about 1000 pF exists between the signal ground line 7 and the ground (GND), impedance Z2 is expressed by the following equation.

$$Z2 = 1/j\omega Cf2$$

Unless electrostatic capacitance Cf2 exists, the impedance Z2 is several gigaohms because usually a floating capacitance of several picofarads only exists. When the electrostatic capacitance 10 is provided, the impedance Z2 becomes several megaohms to several hundreds of megaohms. The sensor outputs depend on a ratio of the impedances Z1 and Z2, so that the influence of the noise on the sensor output can be omitted in the case of Z1>>Z2.

Figure 5:
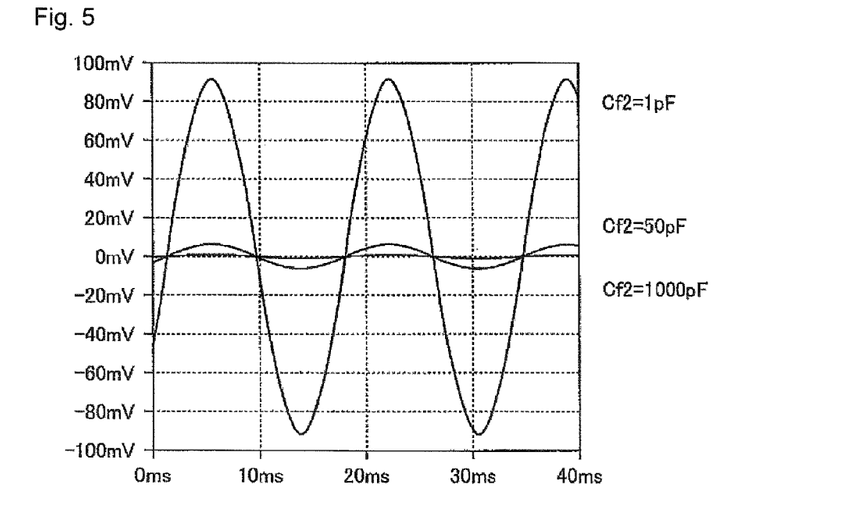
FIG. 5 is a view illustrating a relationship between an electrostatic capacitance in FIG. 1 and a noise level.
Figure 6:
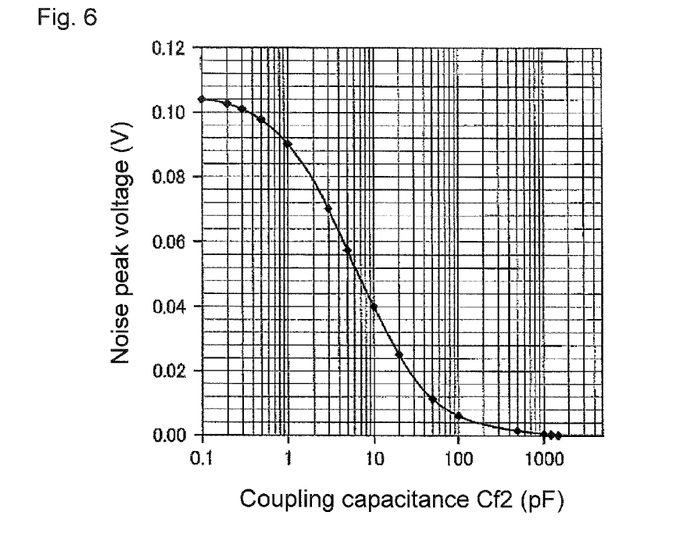
FIG. 6 is a view illustrating a relationship between the electrostatic capacitance and a noise peak voltage.

FIG. 5 is a view illustrating a relationship between the electrostatic capacitance 10 in FIG. 1 and a noise level. In FIG. 5, a horizontal axis indicates time, and a vertical axis indicates a noise potential. FIG. 6 is a view illustrating a relationship between a change in capacitance Cf2 of the electrostatic capacitance 10 and a noise peak voltage. In FIG. 6, a horizontal axis indicates the electrostatic capacitance Cf2, and a vertical axis indicates a noise peak voltage.

As illustrated in FIG. 5, the noise of about 90 mV emerges in the case that the capacitance Cf2 of the electrostatic capacitance 10 is as small as 1 pF, the noise level is reduced to about 5 mV when the capacitance Cf2 becomes 50 pF, and the noise is substantially eliminated when the capacitance Cf2 is as large as 1000 pF. This is also apparent from the relationship between the change in capacitance Cf2 of the electrostatic capacitance 10 and the noise peak voltage in FIG. 6. As illustrated in FIG. 6, the noise peak voltage of about 0.12 V emerges when the electrostatic capacitance Cf2 is as small as about 0.1 pF, and the noise peak voltage becomes substantially zero level when the electrostatic capacitance Cf2 is as large as about 1000 pF.

Figure 7:
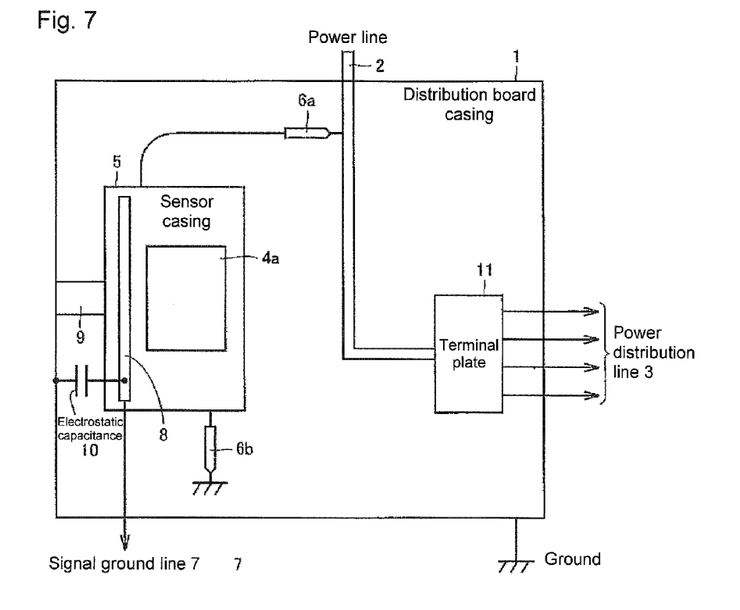
FIG. 7 is an equivalent circuit diagram illustrating an example, in which differential measurement is performed with two sensors, as a second embodiment of the present invention.

FIG. 7 is a block diagram illustrating a measurement device according to a second embodiment of the present invention. In a configuration of the second embodiment in FIG. 7, the potential between the power line 2 and the ground (GND) is taken out using a pair of probes 6a and 6b. The sensor casing 5 is provided with a measurement circuit 4a including a differential amplifier circuit. Other configurations of the second embodiment are similar to those in FIG. 1.

Figure 8:
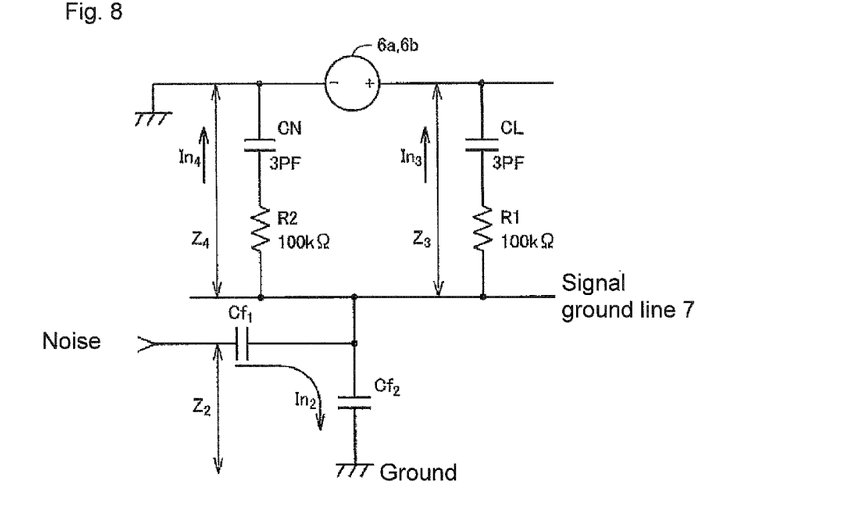
FIG. 8 is an equivalent circuit diagram of the second embodiment in FIG. 7.

FIG. 8 is an equivalent circuit diagram of the second embodiment in FIG. 7. Referring to FIG. 8, a capacitance CL of the probe 6a and the wiring in FIG. 7 and a capacitance CN of the probe 6b and the wiring exist in parallel to each other, a detection resistance R1 of, for example, 100 kω is connected between one of input terminals of the differential amplifier circuit and the signal ground line 7, and a detection resistance R2 of, for example, 100 kω is connected between the other input terminal of the differential amplifier circuit and the sensor ground line 7. The capacitances CL and CN of the probe 6a and 6b and the wirings exist in parallel to each other, and a state of Z3≠Z4 is obtained. Even if the differential circuit is in an unbalanced state, Z3+Z4>>Z2 is obtained because of the large electrostatic capacitance Cf2. Even in the second embodiment of FIG. 7, the current In2 passed through the electrostatic capacitance Cf2 is larger than the total of a current In3 passed through the detection resistance R1 and a current In4 passed through the detection resistance R2, so that the influence of the noise on the sensor output can be omitted. The configuration of the second embodiment can be applied to the case that the differential voltage between the power line 2 and another power line is measured (for example, the case that a three-phase AC line voltage is measured).

Figure 9:
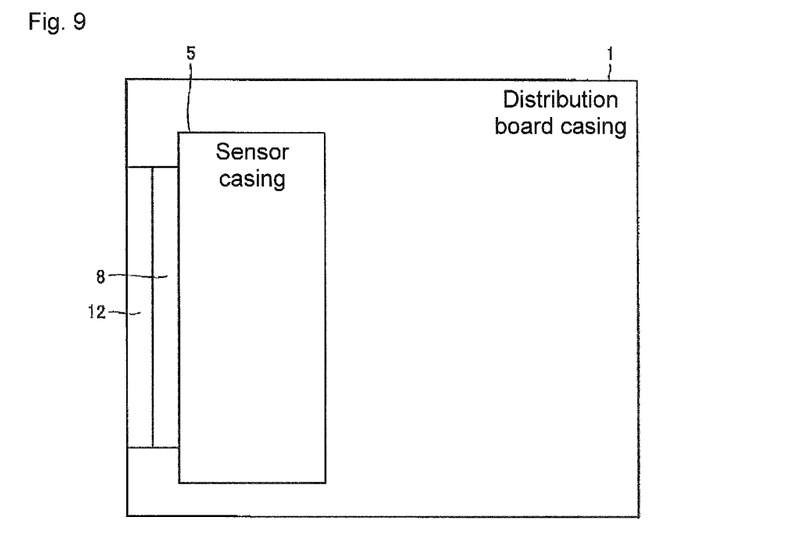
FIG. 9 is a block diagram illustrating a measurement device according to a third embodiment of the present invention.

FIG. 9 is a block diagram illustrating a measurement device according to a third embodiment of the present invention.

Referring to FIG. 9, the sensor casing 5 is formed into a rectangular shape, the metal plate 8 is provided along a lengthwise direction outside the sensor casing 5, and an insulating member 12 made of, for example, resin is provided between the metal plate 8 and the lateral surface of the distribution board casing 1 while being in close contact with the metal plate 8. In FIG. 9, with no use of the magnet 9, the metal plate 8 and the insulating member 12 are fixed between the sensor casing 5 and the side wall of the distribution board casing 1 using an adhesive.

The electrostatic capacitance Cf2 between the metal plate 8 and the lateral surface of the distribution board casing 1 can be increased by forming the insulating member 12 into the substantially same shape as the metal plate 8. The relative positions of the metal plate 8 and the sensor casing 5 can be fixed by the insulating member 12. The power line 2, the probe 6, and the terminal board 11 are not illustrated in FIG. 9.

Figure 10:
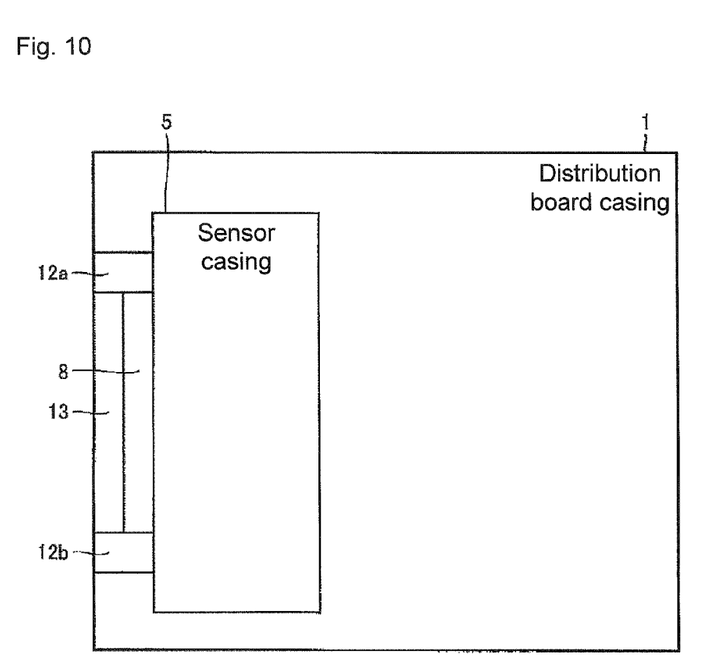
FIG. 10 is a block diagram illustrating a measurement device according to a fourth embodiment of the present invention.

FIG. 10 is a block diagram illustrating a measurement device according to a fourth embodiment of the present invention.

Referring to FIG. 10, insulating members 12a and 12b are provided so as to sandwich top and bottom surfaces of the metal plate 8 provided in the sensor casing 5, and the insulating members 12a and 12b are provided between the sensor casing 5 and the lateral surface of the distribution board casing 1 while divided in the lengthwise direction. A gap 13 is formed on the lateral surface side of the distribution board casing 1 of the metal plate 8. In the fourth embodiment, the electrostatic capacitance is formed by the insulating members 12a and 12b existing between the metal plate 8 and the lateral surface of the distribution board casing 1, and the electrostatic capacitance between the metal plate 8 and the lateral surface of the distribution board casing 1 is formed by the gap 13, so that the electrostatic capacitance can further be increased. Alternatively, the gap 13 may be subjected to insulating painting or insulating coating.

For example, the member in which the surface of the conductive member is subjected to the insulating painting or the insulating coating is used as the insulating members 12, 12a, and 12b in FIGS. 9 and 10. For example, the insulating members 12, 12a, and 12b can be fixed to the sensor casing 5 and the distribution board casing 1 using a hook and loop fastener, a double-sided tape, an adhesive, a sucker, or a sticky sheet. Alternatively, a projection (hook) is provided on the distribution board casing 1, and the projection may be hooked in holes made in the insulating members 12, 12a, and 12b. Alternatively, the insulating members 12, 12a, and 12b may be screwed in the distribution board casing 1, or the insulating members 12, 12a, and 12b may be mounted on the distribution board casing 1 by sandwiching the insulating members 12, 12a, and 12b between the magnet and the distribution board casing 1.

As described above, the insulating members 12, 12a, and 12b are disposed between the metal plate 8 provided in the sensor casing 5 and the distribution board casing 1, and the electrostatic capacitance between the metal plate 8 and the distribution board casing 1 is formed to pass the noise current through the electrostatic capacitance, which allows the decrease of the noise current passed through the measurement circuit 4.

In one or more of the above embodiments, the sensor casing 5 is disposed inside the lateral surface of the distribution board casing 1. Alternatively, the sensor casing 5 may be disposed on any position, for example, on the outside of the lateral surface, or an inside or an outside of a door portion.

In one or more of the above embodiments, the measurement circuit 4 is accommodated in the sensor casing 5, and the signal ground line 7 of the measurement circuit 4 is electrically connected to the metal plate 8. Alternatively, the insulating member and the metal plate 8 are unitized in order to form the electrostatic capacitance with the external conductor, and the commercially available measurement device is mounted on the mounting unit to electrically connect the ground line of the measurement device to the metal plate 8, which allows the reduction of the noise mixed in the measurement device.

Figure 11:
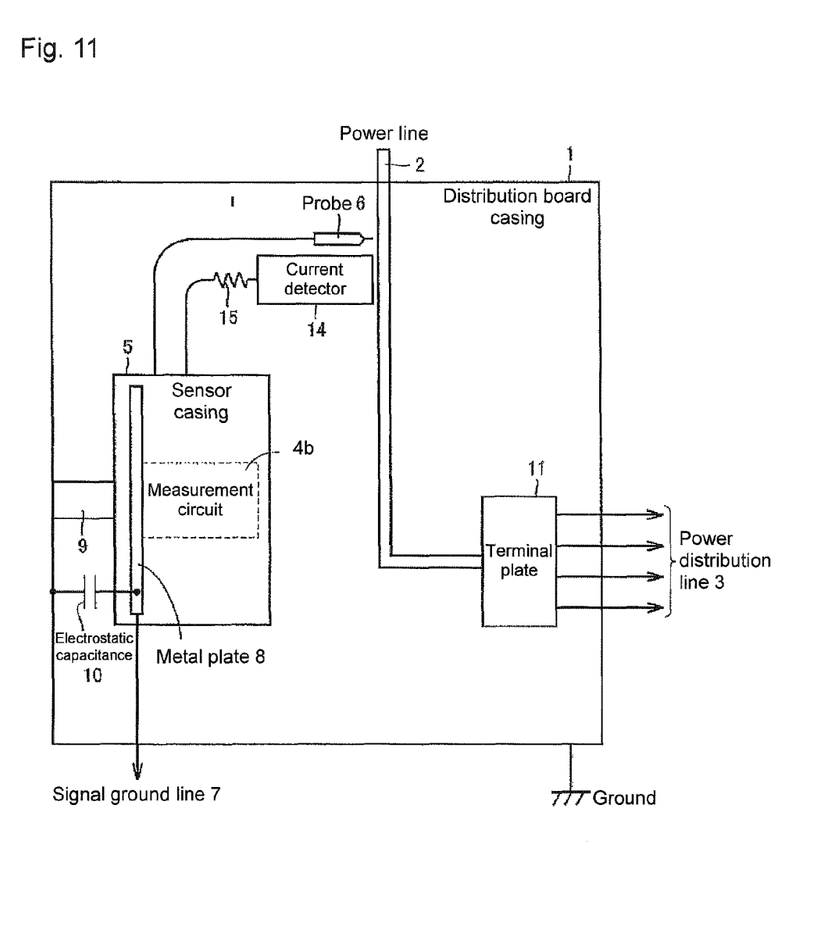
FIG. 11 is a block diagram illustrating a measurement device according to a fifth embodiment of the present invention.

FIG. 11 is a block diagram illustrating a measurement device according to a fifth embodiment of the present invention. In the configuration of the fifth embodiment, the power consumption can be measured by measuring the voltage and the current of the power line 2. In addition to the configuration of the first embodiment in FIG. 1, a current detector 14 that activates as another example of the sensor is electromagnetically coupled to the power line 2 in parallel to the probe 6. For example, the current detector 14 is constructed with a current transformer (CT) or a Hall element.

The output signal of the current detector 14 is provided to a measurement circuit 4b through a detection resistance 15. The probe 6 is connected to the measurement circuit 4b, and the measurement circuit 4b measures the power consumption on the power line 2 based on the current detected by the current detector 14 and the voltage obtained by the current generated in the probe 6. In the fifth embodiment, the power consumption can be measured with no influence of the noise mixed in the measurement circuit 4b.

In the fifth embodiment, the power supplied from the power distribution line 3 can be measured when the probe 6 and the current detector 14 are brought close to the power distribution line 3 in a non-contact manner.

The necessity of the wiring work may be eliminated in the measurement device according to one or more embodiments of the present invention, and the measurement device can be used to measure the power consumption in non-contact with the power line while the mixture of the noise in the sensor output is prevented.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS 1 distribution board casing
2 power line
3 power distribution line
4,4a,4b measurement circuit
5 sensor casing
6,6a,6b probe
7 signal ground line
8 metal plate
9 magnet
10 electrostatic capacitance
111 noise source
12,12a,12b insulating member
13 gap
14 current detector
15 detection resistance

The invention claimed is:

1. A measurement device comprising:
a sensor that generates current by electromagnetic coupling to a power line;
a measurement circuit that measures one of voltage and power, the voltage and the power being obtained by the current generated in the sensor according to voltage at the power line;
a conductive member electrically connected to a signal ground line of the measurement circuit; and
an insulating member disposed between the conductive member and an external conductor and insulates the conductive member from the external conductor,
wherein an electrostatic capacitance is formed between the conductive member and the external conductor while the insulating member is interposed between the conductive member and the external conductor.

2. The measurement device according to claim 1, wherein the insulating member fixes relative positions of the conductive member and the external conductor.

3. The measurement device according to claim 1, wherein the conductive member is a magnet.

4. The measurement device according to claim 2, wherein the conductive member is a magnet.

5. The measurement device according to claim 1 wherein the insulating member is a sensor casing formed by resin.

6. A mounting unit, comprising:
a sensor that generates current by electromagnetic coupling to a power line;

a measurement circuit that measures one of voltage and power, the voltage and the power being obtained by the current generated in the sensor according to voltage at the power line a conductive member electrically connected to signal ground of the measurement circuit; and an insulating member interposed between the conductive member and an external conductor, the insulating member forming electrostatic capacitance between the conductive member and the external conductor, wherein the mounting unit is configured to mount the measurement circuit on the external conductor electrically connected to ground.

7. The mounting unit according to claim 6, wherein the insulating member fixes relative positions of the conductive member and the external conductor.

8. The mounting unit according to claim 6, wherein the conductive member is a magnet.

9. The mounting unit according to claim 6, wherein the insulating member is a sensor casing formed by resin.

\* \* \* \* \*